US012677658B2

(12) United States Patent　　　　　(10) Patent No.: US 12,677,658 B2
Malinowski et al.　　　　　　　　　　(45) Date of Patent: Jul. 7, 2026

(54) PACKAGE WITH THERMAL CONDUCTIVE MATERIAL INTERSPERSED IN DEPOPULATED REGIONS OF SOLDER BUMPS

(71) Applicant: GlobalFoundries U.S. Inc., Malta, NY (US)

(72) Inventors: John C. Malinowski, Jericho, VT (US); Zhuojie Wu, Port Chester, NY (US)

(73) Assignee: GLOBALFOUNDRIES U.S. Inc, Malta, NY (US)

( * ) Notice: Subject to any disclaimer, the term of this patent is extended or adjusted under 35 U.S.C. 154(b) by 869 days.

(21) Appl. No.: 17/902,506

(22) Filed: Sep. 2, 2022

(65) Prior Publication Data

US 2024/0079371 A1　　Mar. 7, 2024

(51) Int. Cl.
H01L 23/498 (2006.01)
H01L 23/00 (2006.01)
(Continued)

(52) U.S. Cl.
CPC ........... H10W 40/00 (2026.01); H10W 40/22 (2026.01); H10W 72/072 (2026.01); H10W 72/07235 (2026.01); H10W 72/07236 (2026.01); H10W 72/073 (2026.01); H10W 72/07332 (2026.01); H10W 72/07353 (2026.01); H10W 72/07354 (2026.01); H10W 72/241 (2026.01);
(Continued)

(58) Field of Classification Search
CPC ......... H01L 23/49838; H01L 23/49822; H01L 23/49866; H01L 23/49894; H01L 23/49833; H01L 21/4853; H01L 21/4857; H01L 23/3735; H01L 23/5383; H01L 2924/1517; H01L 23/34; H01L 23/36; H01L 23/367; H01L 23/3677; H01L 23/373; H01L 23/3731–3738; H01L 23/42; H01L 21/563
See application file for complete search history.

(56) References Cited

U.S. PATENT DOCUMENTS 6,800,946 B2 * 10/2004 Chason .................. H01L 21/56
29/841
8,411,444 B2 4/2013 Gaynes et al.
(Continued)

OTHER PUBLICATIONS

Wessel W. Wits et al., "TRIZ based interface conflict resolving strategies for modular product architectures", https://www.sciencedirect.com/science/article/pii/S1877705811001159, Procedia Engineering, vol. 9, 2011, pp. 30-39, ISSN 1877-7058, 10 pages.
(Continued)

*Primary Examiner* — Wael M Fahmy
*Assistant Examiner* — Aneesa Riaz Baig
(74) *Attorney, Agent, or Firm* — Anthony Canale; Andrew M. Calderon; Calderon Safran & Wright P.C.

(57) ABSTRACT

The present disclosure relates to radio frequency (RF) chip packages and, more particularly, to improved thermal performance of RF chip packages and methods of manufacture. The structure includes: a board; a chip substrate; a pattern of solder bumps between the board and the chip substrate; and a thermal conductive material between the chip substrate and the board in depopulated regions of solder bumps of the chip substrate.

17 Claims, 6 Drawing Sheets

(51) Int. Cl.

| | |
|---|---|
| *H10D 1/60* | (2025.01) |
| *H10W 40/00* | (2026.01) |
| *H10W 40/22* | (2026.01) |
| *H10W 72/00* | (2026.01) |
| *H10W 72/20* | (2026.01) |
| *H10W 72/30* | (2026.01) |
| *H10W 74/15* | (2026.01) |
| *H10W 90/00* | (2026.01) |
| *H10W 99/00* | (2026.01) |

(52) U.S. Cl.
CPC ........ *H10W 72/248* (2026.01); *H10W 72/252* (2026.01); *H10W 72/325* (2026.01); *H10W 72/332* (2026.01); *H10W 72/337* (2026.01); *H10W 72/347* (2026.01); *H10W 72/352* (2026.01); *H10W 72/353* (2026.01); *H10W 72/354* (2026.01); *H10W 72/357* (2026.01); *H10W 72/856* (2026.01); *H10W 74/15* (2026.01); *H10W 90/701* (2026.01); *H10W 90/724* (2026.01); *H10W 90/734* (2026.01)

(56) References Cited

U.S. PATENT DOCUMENTS

| | | | |
|---|---|---|---|
| 8,531,841 B2 | 9/2013 | Lee | |
| 9,627,346 B2 * | 4/2017 | Hsu | H01L 21/563 |
| 9,698,072 B2 | 7/2017 | Brofman et al. | |
| 10,490,471 B2 | 11/2019 | Costa et al. | |
| 11,075,122 B2 | 7/2021 | Shioda et al. | |
| 11,112,841 B2 * | 9/2021 | Mani | H05K 1/0204 |
| 11,217,460 B2 | 1/2022 | Kulkarni et al. | |
| 12,033,963 B2 * | 7/2024 | Tsai | H01L 23/291 |
| 2003/0206401 A1 * | 11/2003 | Zhou | H01L 23/3677 |
| | | | 361/764 |
| 2004/0118599 A1 * | 6/2004 | Chason | H01L 21/56 |
| | | | 257/E21.503 |
| 2005/0245060 A1 * | 11/2005 | Chiu | H01L 23/3677 |
| | | | 257/E23.105 |
| 2009/0057877 A1 * | 3/2009 | Touzelbaev | H01L 21/50 |
| | | | 257/706 |
| 2009/0236729 A1 * | 9/2009 | Fann | H01L 23/3735 |
| | | | 257/E23.079 |
| 2012/0061854 A1 * | 3/2012 | Chow | H01L 21/563 |
| | | | 257/E21.511 |
| 2020/0013693 A1 * | 1/2020 | Lambert | H01L 21/4853 |
| 2020/0126887 A1 | 4/2020 | Lin et al. | |
| 2021/0118770 A1 | 4/2021 | Kuo et al. | |
| 2024/0059946 A1 * | 2/2024 | He | C08K 5/0025 |

OTHER PUBLICATIONS

Zhuo-Jie Wu et al., "Enhanced WLCSP Reliability for RF Applications", 2020 IEEE Electron Devices Technology and Manufacturing Conference Proceedings of Technical Papers, 4 pages.

Haojun Zhang et al., "45RFSOI WLCSP Board Level Package Risk Assessment and Solder Joint Reliability Performance Improvement", 2020 IEEE 70th Electronic Components and Technology Conference (ECTC), 6 pages.

Zhuo-Jie Wu et al., "Understanding and Improving Reliability for Wafer Level Chip Scale Package: A Study Based on 45nm RFSOI Technology for 5G Applications" in IEEE Journal of the Electron Devices Society, vol. 8, pp. 1305-1314, 2020, doi: 10.1109/JEDS.2020.3023007, 10 pages.

* cited by examiner

PACKAGE WITH THERMAL CONDUCTIVE MATERIAL INTERSPERSED IN DEPOPULATED REGIONS OF SOLDER BUMPS

BACKGROUND

The present disclosure relates to radio frequency (RF) chip packages and, more particularly, to improved thermal performance of RF chip packages and methods of manufacture.

RF components consume more power as frequency increases. For example, a typical 5G base station can consume twice or more the power of a 4G base station, and energy costs can grow even more at higher frequencies due to a need for more antennas and a denser layer of small cells. For example, 5G macro base stations may require several new, continuously running, power-hungry components, including microwave or millimeter wave transceivers, field-programmable gate arrays (FPGAs), faster data converters, high-power/low-noise amplifiers and integrated MIMO antennas, to name some of the components.

Heat generated by high-power consuming dies may cause problems such as thermal crosstalk for neighboring semiconductor dies, negatively affecting the performance and reliability of the neighboring semiconductor dies. As such, the overall performance and reliability of the semiconductor package itself may be diminished and degraded. With this noted, as the trend of increased power density continues, there is a greater demand for better thermal management, which is a larger percentage of the total cost of the product and which is very challenging to accomplish efficiently. In fact, efficient dissipation of the heat generated in stacked dies may be particularly difficult. For example, in a 3D semiconductor package, the heat generated by the stacked dies have to be dissipated to outer components before the heat can be conducted to a heat dissipation element (e.g., heat spreader).

SUMMARY

In an aspect of the disclosure, a structure comprises: a board; a chip substrate; a pattern of solder bumps between the board and the chip substrate; and a thermal conductive material between the chip substrate and the board in depopulated regions of solder bumps of the chip substrate.

In an aspect of the disclosure, a structure comprises: a first board; a second board; a ball grid array connecting the first board to the second board; and a thermal conductive material between the first board and the second board in regions which are devoid of the ball grid array.

In an aspect of the disclosure, a method comprises: placing thermal conductive material in regions of one of a chip substrate and a board that is devoid of the solder bumps; and connecting the chip substrate to the board by applying a force such that the thermal conductive material is squeezed and in physical contact with both the chop substrate and the board.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to radio frequency (RF) chip packages and, more particularly, to improved thermal performance of RF chip packages and methods of manufacture. More specifically, the present disclosure provides RF chip packages with thermal conductive material in depopulated areas between the chip/package and a chip substrate. Advantageously, the use of the thermal interface material will improve heat dissipation and solder joint chip-package interaction (CPI) reliability.

In more specific embodiments, the RF chip packages include thermal conductive material (e.g., thermal interface material (TIM)) between a chip/package and a board/substrate in an area where solder bumps are not present (i.e., depopulated area). The thermal conductive material (e.g., TIM) may be provided in many different configurations (shapes), depending on the solder bump pattern. In embodiments, the thermal conductive material may be a paste or a die cut TIM material, the latter of which provides precise placement in depopulated areas. In further embodiments, the thermal conductive material (e.g., TIM) may be provided in a fan out package or flip chip BGA package.

Figure 1:
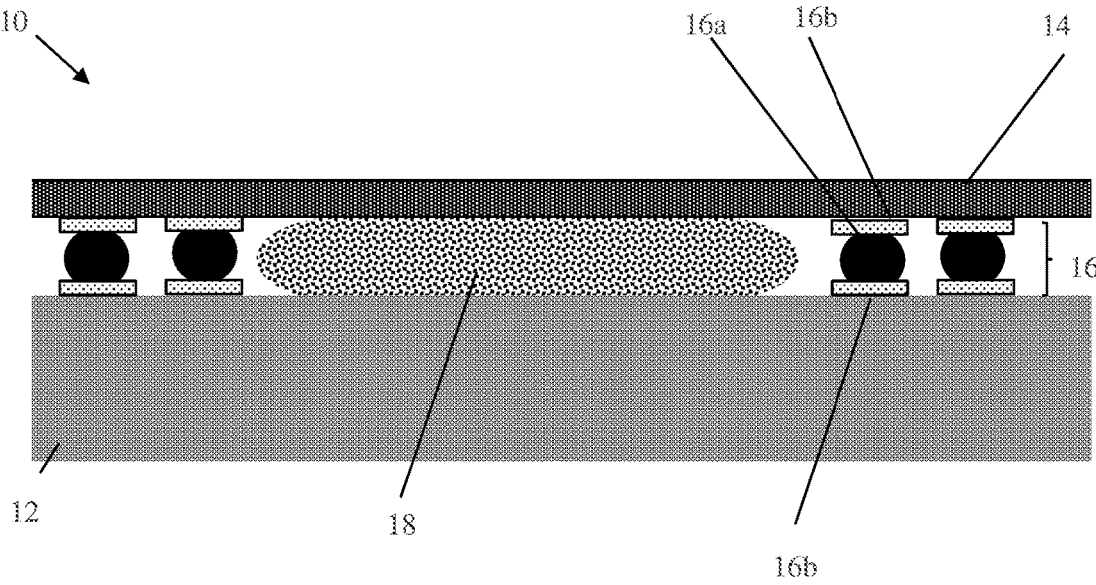
FIG. 1 shows an RF chip package with thermal interface material in accordance with aspects of the present disclosure.

FIG. 1 shows an RF chip package with thermal interface material in accordance with aspects of the present disclosure. In embodiments, the RF chip package 10 may include a board 12 and chip substrate 14. In embodiments, the chip substrate 14 may be any semiconductor substrate such as semiconductor-on-insulator (SOI) or bulk Si, as examples. The board 12 may be any heat dissipating board used with BGA technologies, as an example. In this way, the board 12 may act as a heat sink for the chip substrate 14.

The chip substrate 14 may be bonded to the board 12 by BGA 16. In embodiments, the BGA 16 includes a solder ball 16a between two solder pads 16b. In embodiments, one solder pad 16b may be bonded to the board 12 and the other solder pad 16b may be bonded to the chip substrate 14 as is known in the art such that no further explanation is required for a complete understanding of the present disclosure. The BGA 16 may include different grid patterns as shown representatively in FIGS. 6A-6I.

Still referring to FIG. 1, a thermal conductive material (e.g., TIM) 18 may be placed between the board 12 and the chip substrate 14. In embodiments, the thermal conductive material (e.g., TIM) 18 may be provided in depopulated areas (e.g., areas not occupied by the BGA 16) within an interior of the chip package 10 as shown in FIGS. 6A-6I as examples. In embodiments, the depopulated areas are away from an edge of the chip substrate 14. The thermal conductive material (e.g., TIM) 18 may be squeezed between and in direct physical contact with the board 12 and the chip substrate 14. Also, in embodiments, the thermal conductive material 18 be any known electrically insulative material such as, e.g., non-metallic TIM, metallic TIM, or TIM with fillers such as silica or boron nitride as examples. By using the thermal conductive material 18, heat generated on the chip substrate 14 can now be effectively and efficiently dissipated to the board 12, hence improving the thermal performance of the package 10.

Figure 2:
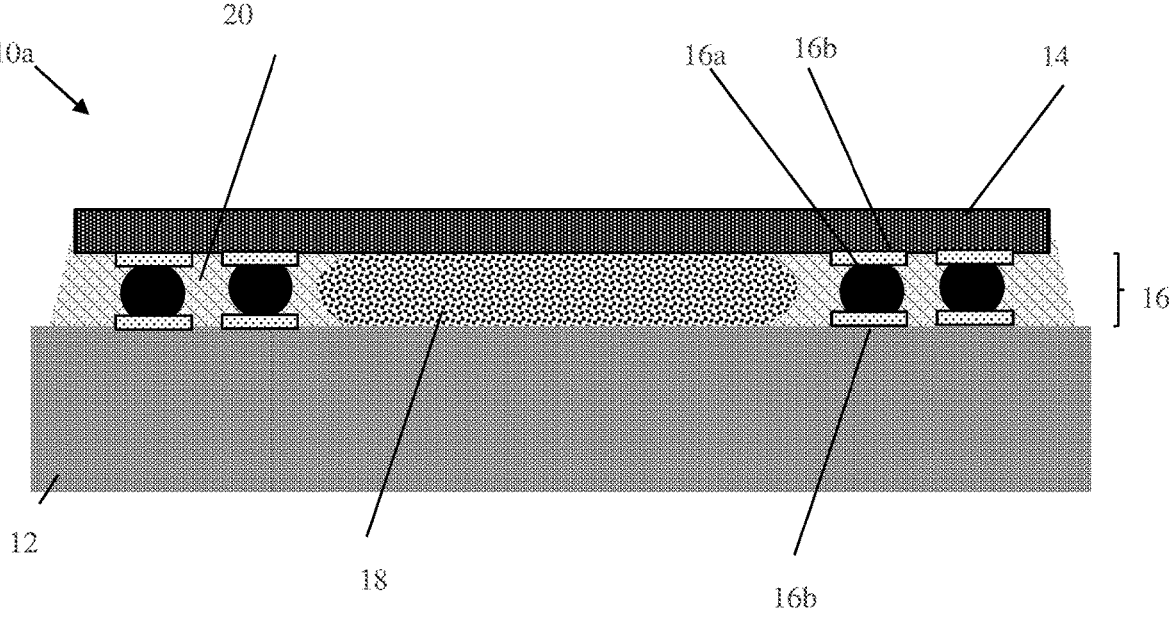
FIG. 2 shows an RF chip package with thermal interface material and underfill material in accordance with aspects of the present disclosure.

FIG. 2 shows an RF chip package with thermal interface material and underfill material in accordance with aspects of the present disclosure. More specifically, in the RF chip package 10a of FIG. 2, an underfill material 20 may be provided between the chip substrate 14 and the board 12, at edges of the package 10a and interspersed within the BGA 16. In addition, as in each of the embodiments, the thermal conductive material 18 may be provided within the depopu- lated areas between the BGA 16.

In embodiments, the underfill material 20 may be any known underfill material 20 such as flowable epoxy with silicon fillers. As should be understood by those of skill in the art, the underfill material 20 is only provided in popu- lated areas of the BGA 16 at edges or other locations of the board 12. In embodiments, the underfill material 20 is provided in populated area because the depopulated area is already occupied by thermal conductive material 18, which is applied prior to the underfill material 20.

It should also be recognized that the thermal conductive material 18 has a higher viscosity and thermal conductive properties than the underfill material 20. As such, the underfill material 20 cannot and is not a substitute for the thermal conductive material 18. The remaining features of the package 10a are similar to the package 10 of FIG. 1.

Figure 3A:
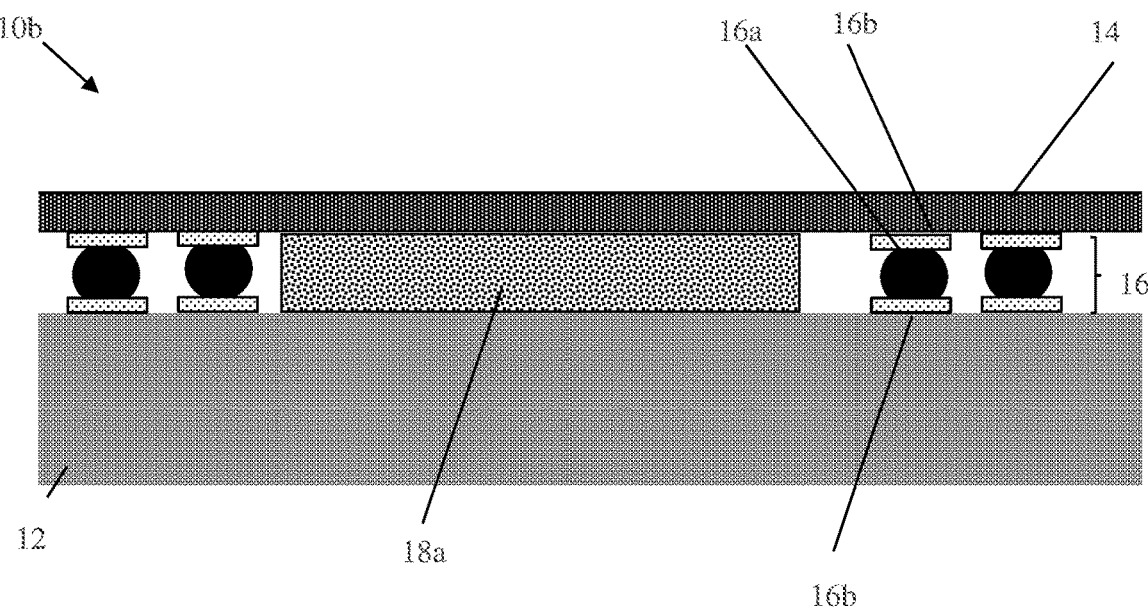
FIG. 3A shows a top view of an RF chip package with thermal interface material and FIG. 3B shows a cross-sectional view of the RF chip package of FIG. 3A, in accordance with aspects of the present disclosure.
Figure 3B:
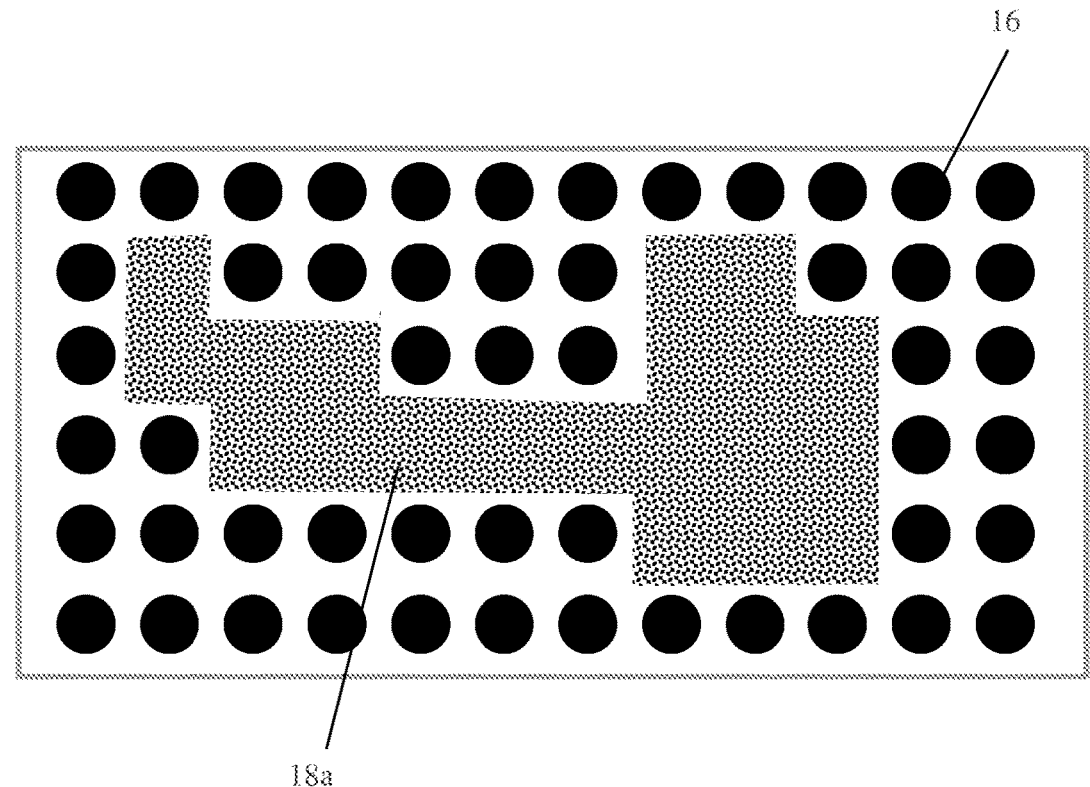

FIG. 3A shows a top view of an RF chip package with thermal interface material and FIG. 3B shows a cross- sectional view of the RF chip package of FIG. 3A. More specifically, in the RF chip package 10b of FIGS. 3A and 3B, the thermal conductive material 18a is a die cut TIM material. In this way, the thermal conductive material 18a can be precisely fit into the depopulated areas between the BGA 16. In this embodiment, underfill material as shown in FIG. 2 is also contemplated for use in the package 10b. The remaining features are similar to the structure 10 of FIG. 1.

Figure 4:
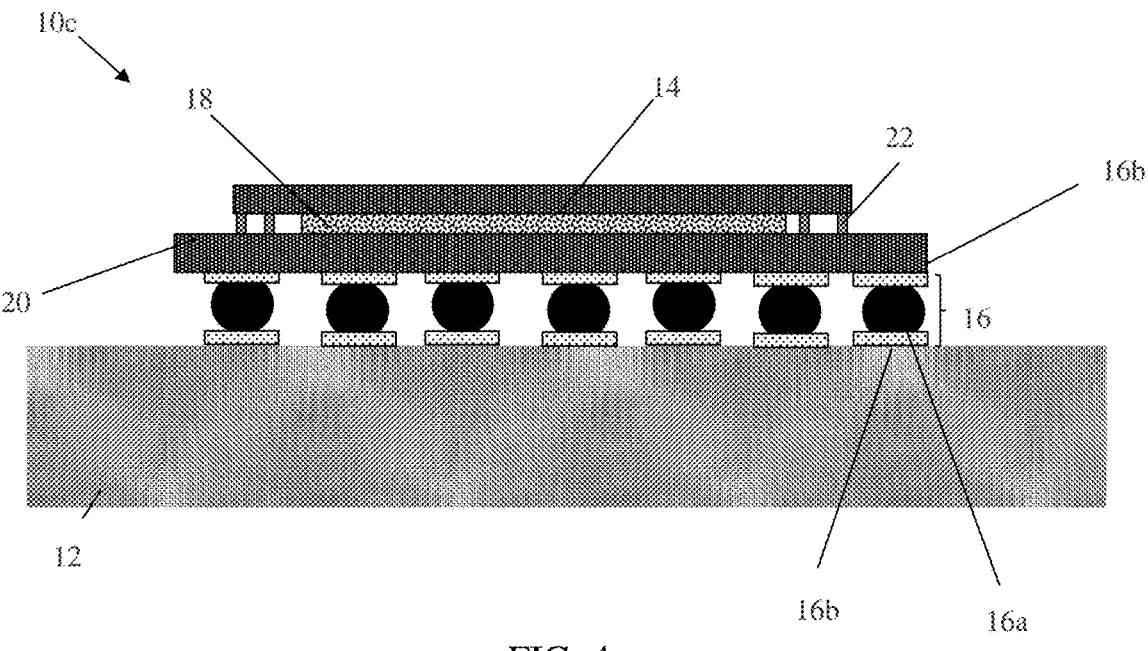
FIG. 4 shows a flip chip ball grid array (BGA) package in accordance with aspects of the present disclosure.

FIG. 4 shows a flip chip BGA package in accordance with aspects of the present disclosure. In this embodiment, the flip chip BGA package 10c includes an intermediate lami- nate 20 between the chip substrate 14 and the board 12. The intermediate laminate 20 may be bonded to the board 12 by the BGA 16 and connected to the chip substrate 14 using pins 22, such as C4 bumps, Cu Pillars, Micro Pillars. The intermediate laminate 20 may be used to allow fine pitches on the chip substrate 14 to connect to the board 12. In this embodiment, the thermal conductive material (e.g., TIM) 18 may be between the intermediate laminate 20 and the chip substrate 14 and, more specifically, within areas devoid of the pins 22 in an interior portion of the chip substrate 14.

Figure 5:
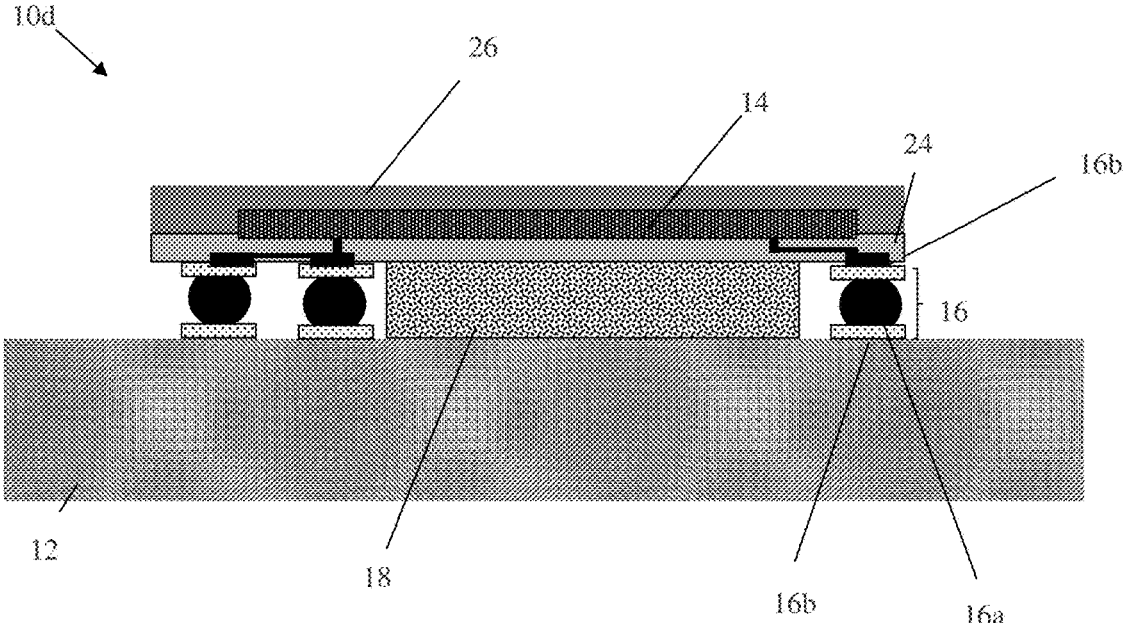
FIG. 5 shows a fan out package in accordance with aspects of the present disclosure.

FIG. 5 shows a fan out package in accordance with aspects of the present disclosure. In this embodiment, the fan out package 10d includes a redistribution layer 24 on the chip substrate 14. The chip substrate 14 with redistribution layer 24 may be bonded to the board 12 by the BGA 16. The redistribution layer 24 may be used to redistribute the connections of the substrate 14 to the board 12. A mold compound 26, as is known in the art, may be provided around the chip substrate 14. In this embodiment, the thermal conductive material 18 may be between the redis- tribution layer 24 and the chip substrate 14 and, more specifically, within areas devoid of the BGA 16 in an interior portion of the chip substrate 14. As with each of the embodiments, an underfill material may also be used at the areas with BGA population of the package 10d.

FIGS. 6A-6I show various BGA grid patterns in accor- dance with aspects of the present disclosure. In each of these BGA grid patterns, the thermal conductive material 18 may be in depopulated areas within an interior portion 14a of the chip substrate 14. Also, in each of the embodiments, the thermal conductive material 18 need not be present in each and every depopulated area; instead, the thermal conductive material 18 may be present in those areas best suited to dissipate heat away from the chip substrate 14.

Figures 6A, 6B, 6C, 6D:
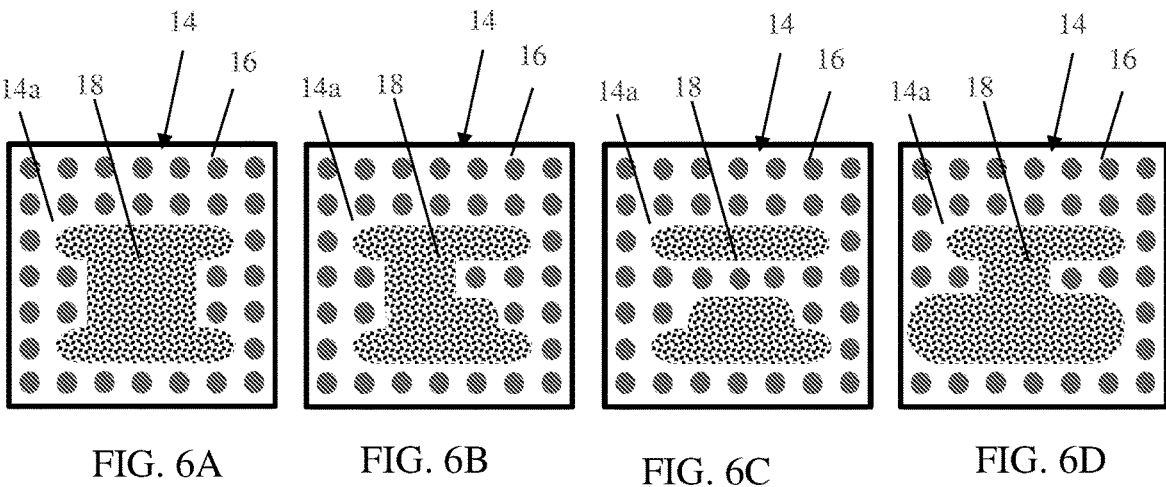
FIGS. 6A-6I show various BGA grid patterns in accordance with aspects of the present disclosure.

In FIG. 6A, the thermal conductive material 18 may be in an "I" shape in depopulated areas within an interior portion 14a of the chip substrate 14. In FIG. 6B, the thermal conductive material 18 may be in an "I" shape with a stepped, horizontal leg feature in depopulated areas within an interior portion 14a of the chip substrate 14. In FIG. 6C, the thermal conductive material 18 may be separate bar shapes with one bar shape having a stepped feature, and both bars in depopulated areas within an interior portion 14a of the chip substrate 14. In FIG. 6D, the thermal conductive material 18 may be in an offset "I" shape in depopulated areas within an interior portion 14a of the chip substrate 14.

Figures 6E, 6F, 6G, 6H:
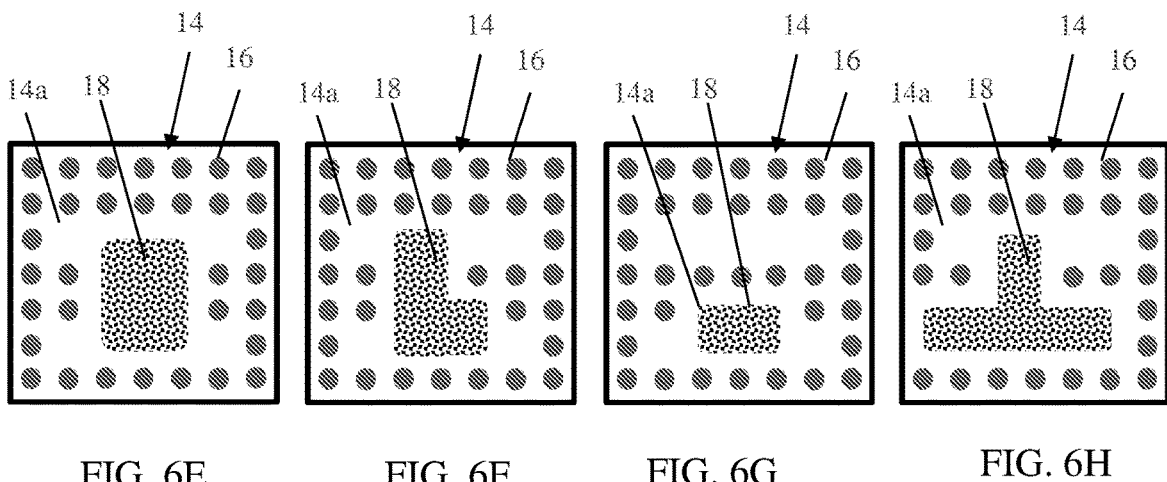
Figure 6I:
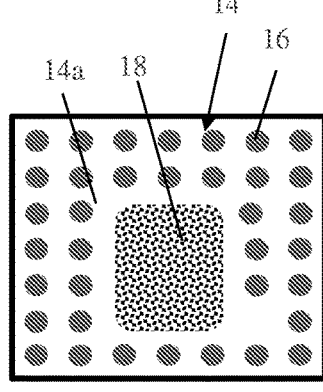

In FIGS. 6E-6H, the thermal conductive material 18 may be provided only in areas where at least two bumps are depopulated in both the x and y axes. FIG. 6I also illustrates that by re-design of the bump depopulation pattern of FIG. 6G thru thermal-electrical co-optimization, it is possible to achieve higher thermal performance with ease of processing. In FIG. 6E, the thermal conductive material 18 may be a box shape in depopulated areas within an interior portion 14a of the chip substrate 14. In FIG. 6F, the thermal conductive material 18 may be a "L" shape in depopulated areas within an interior portion 14a of the chip substrate 14. In FIG. 6G, the thermal conductive material 18 may be a box shape in one depopulated area within an interior portion 14a of the chip substrate 14; whereas another depopulated area is devoid of the thermal conducive material 18. In FIG. 6H, the thermal conductive material 18 may be in an inverted "T" shape in depopulated areas within an interior portion 14a of the chip substrate 14. In FIG. 6I, the thermal conductive material 18 may be in a larger box shape (compared to FIG. 6E) in depopulated areas within an interior portion 14a of the chip substrate 14. As in each of the box shape configu- rations, the box shape may be rectilinear or polygonal shaped.

Figure 7A:
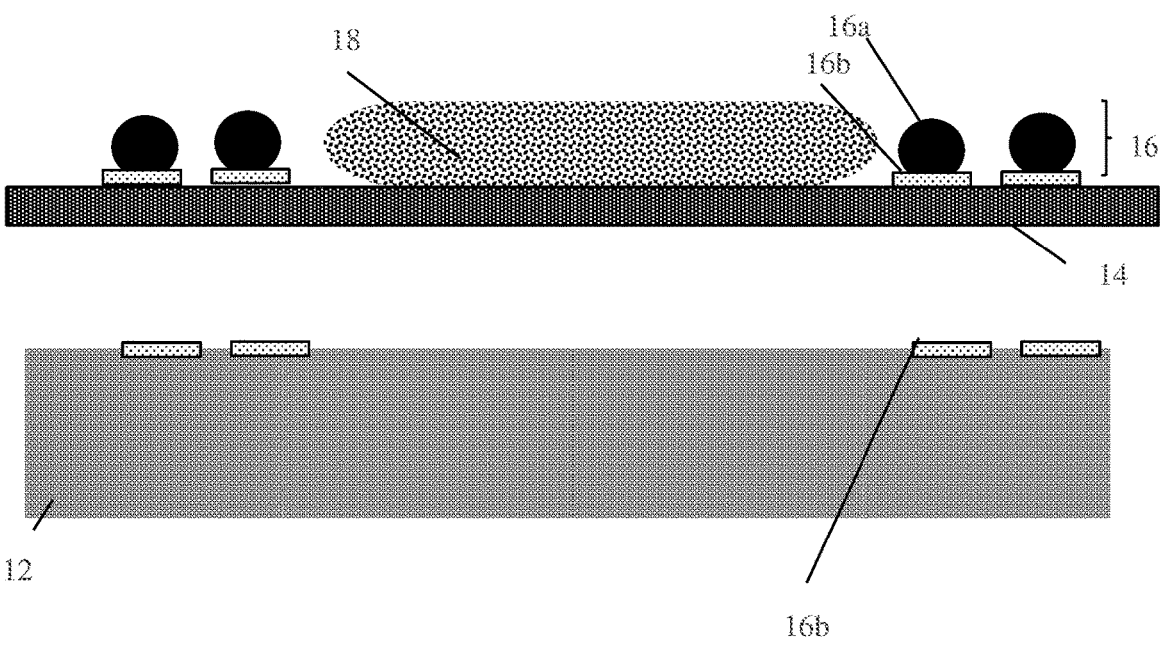
FIGS. 7A-7D show methods of fabricating the RF chip package of FIG. 1 in accordance with aspects of the present disclosure.

FIGS. 7A-7D show methods of fabricating the RF chip package of FIG. 1 in accordance with aspects of the present disclosure. Specifically, FIG. 7A shows the application of the thermal conductive material 18 on a front side of the chip substrate 14 in portions of the chip substrate 14 that are devoid or depopulated of the BGA 16. In this embodiment, as in each of the embodiments, a pad 16b of the BGA may be provided on the board 12 and the pad 16b and solder 16a may be provided on a front side of the chip substrate 14.

Figure 7B:
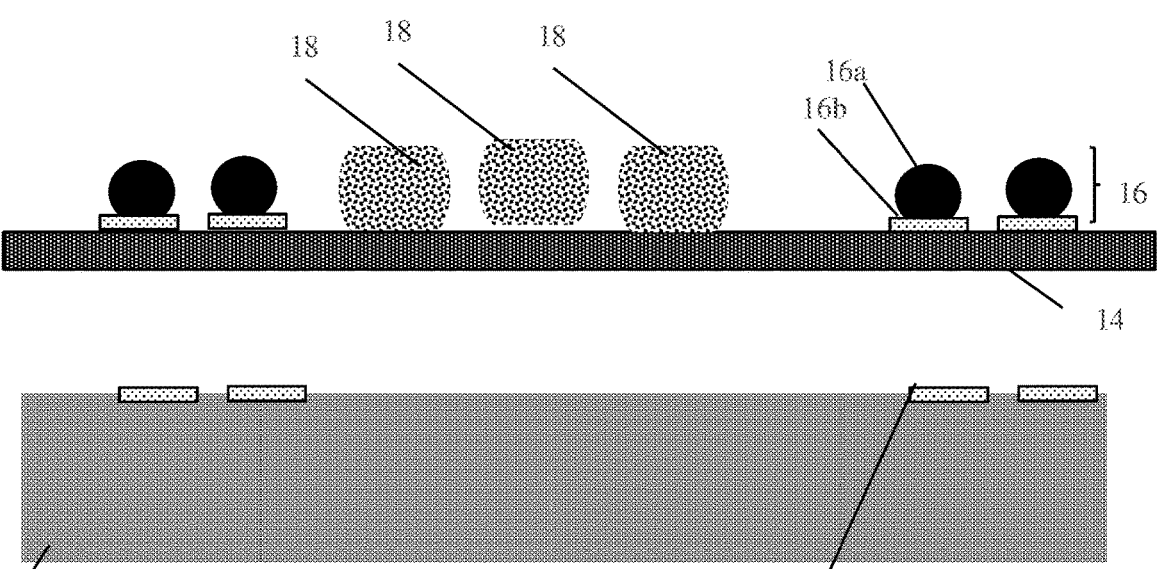
Figures 7C, 7D:
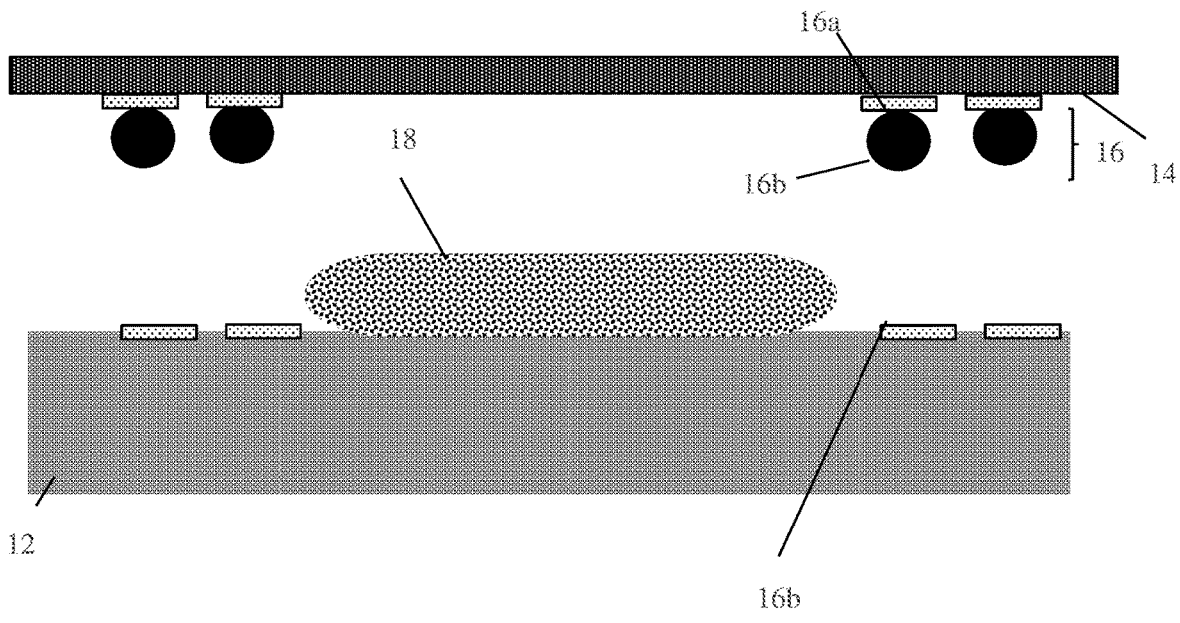

FIG. 7B shows an alternative method of applying the thermal conductive material 18 on a front side of the chip substrate 14. In this embodiment, the thermal conductive material 18 may be applied in two or more discrete portions in the interior portions of the chip substrate 14. FIG. 7C shows an alternative method of applying the thermal con- ductive material 18, in which the thermal conductive material 18 is applied directly to the board 12 (instead of on the chip substrate 14). In this embodiment, the thermal conductive material 18 may be aligned to areas of the chip substrate 14 that are devoid or depopulated of the BGA 16.

As further shown in FIG. 7D, and in any of the embodiments, the chip substrate 14 and the board 12 will be pressed together to squeeze and/or spread the thermal conductive material 18 in the areas devoid or depopulated of the BGA 16. In embodiments, this process may be performed prior to a mass reflow process, or during a thermal compression bonding process or laser assisted bonding process. As should be understood by those of ordinary skill in the art, the thermal compression bonding process requires a force to be applied to the package in order to bond the chip substrate 14 to the board 12, e.g., by bonding the solder bump 16*a* to the solder pad 16*b* on the board 12. A force can also be applied during the laser assisted bonding process. In the laser assisted bonding process, for example, the heating mechanism for flowing of the solder 16 is based on absorption of the laser's energy by a target material. In the thermal compression bonding process, heating and applying thermal and mechanical pressure is used to facilitate the bonding process. On the other hand, a mass reflow process does not include use of a force component and, as such, a force will be applied prior to the mass flow process in order to ensure that the thermal conductive material 18 is adequately bonded to the board 12 and the chip substrate 14.

The RF packages can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a board;
a chip substrate;
a pattern of solder bumps between the board and the chip substrate;
a thermal conductive material between the chip substrate and the board in depopulated regions of solder bumps of the chip substrate; and
underfill material provided between the chip substrate and the board and interspersed within the pattern of solder bumps, wherein the board is a redistribution layer connected to both the chip substrate and a second board, and the thermal conductive material is in contact with the redistribution layer and the second board.

2. The structure of claim 1, wherein the pattern of solder bumps comprise a ball grid array.

3. The structure of claim 1, wherein the thermal conductive material is in physical contact with the chip substrate and the board and the underfill material.

4. The structure of claim 3, wherein the depopulated regions are regions of the chip substrate that are devoid of the solder bumps in an interior portion or edges of the chip.

5. The structure of claim 4, wherein the underfill material is interspersed within and makes contact with the solder bumps and is at edges between the chip substrate and the board.

6. The structure of claim 5, wherein the underfill material and the thermal conductive material are different materials which contact in the depopulated regions.

7. The structure of claim 1, wherein the thermal conductive material is a die cut thermal interface material.

8. The structure of claim 1, further comprising a laminate structure between the chip substrate and the board, wherein the thermal conductive material is in contact with the laminate structure and the chip substrate.

9. The structure of claim 8, wherein the thermal conductive material is in an area devoid of pins that connect the laminate structure to the chip substrate.

10. The structure of claim 1, wherein the thermal conductive material is a region between the redistribution layer and the board that is devoid of solder bumps that bond the redistribution layer to the board.

11. A structure comprising:
a first board;
a second board;
a ball grid array connecting the first board to the second board;
a thermal conductive material between the first board and the second board in regions which are devoid of the ball grid array;
underfill material provided between the first board and the second board and interspersed within the ball grid array and contacting the thermal conductive material in the regions which are devoid of the ball grid array; and
a chip substrate, wherein the first board is a redistribution layer connected to both the chip substrate and the second board, and the thermal conductive material is in contact with the redistribution layer and the second board.

12. The structure of claim 11, wherein the second board is a chip substrate, the ball grid array bonds the chip substrate to the first board, and the thermal conductive material is a thermal interface material.

13. The structure of claim 12, wherein the thermal conductive material is in physical contact with the chip substrate and the first board.

14. The structure of claim 13, wherein the underfill material extends to outer edges thereof between the first board and the second board.

15. The structure of claim 14, wherein the underfill material and the thermal conductive material have different thermal conductivity properties and viscosities.

16. The structure of claim 11, wherein the thermal conductive material is a die cut thermal interface material.

17. A method comprising:

placing thermal conductive material in regions of one of a chip substrate and a board that is devoid of solder bumps;

placing underfill material between a first board and a second board and interspersed within the solder bumps and contacting the thermal conductive material in the regions which are devoid of solder bumps; and connecting the chip substrate to the board by applying a force such that the thermal conductive material is squeezed and in physical contact with both the chip substrate and the board, wherein the first board is a redistribution layer connected to both the chip substrate and the second board, and the thermal conductive material is in contact with the redistribution layer and the second board.

\*  \*  \*  \*  \*